(12) United States Patent
Chang

(10) Patent No.: US 8,933,499 B1
(45) Date of Patent: Jan. 13, 2015

(54) ASYMMETRICALLY STRESSED FIELD EFFECT TRANSISTOR IN DYNAMIC CELL

(71) Applicant: Taiwan Semiconductor Manufacturing Company Ltd., Hsinchu (TW)

(72) Inventor: Chih-Yang Chang, Changhua County (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 14/033,908

(22) Filed: Sep. 23, 2013

(51) Int. Cl.
*H01L 27/108* (2006.01)
*H01L 29/94* (2006.01)
*H01L 21/8238* (2006.01)

(52) U.S. Cl.
CPC .... *H01L 27/10829* (2013.01); *H01L 27/10847* (2013.01)
USPC .......................................... 257/300; 438/210

(58) Field of Classification Search
CPC ..................... H01L 27/0829; H01L 27/10847

USPC ........................................... 257/300; 438/210
See application file for complete search history.

(56) References Cited

U.S. PATENT DOCUMENTS 6,949,783 B2   9/2005   Ahn
7,098,477 B2   8/2006   Zhu et al.

*Primary Examiner* — William D Coleman
(74) *Attorney, Agent, or Firm* — WPAT, P.C.; Anthony King

(57) ABSTRACT

In some embodiments, a circuit element includes a first FET and a first storage capacitor. The first FET includes a gate stack, a first source or drain region, a second source or drain region and a body structure. The gate stack is configured over the body structure. The first source or drain region and the second source or drain region are configured on opposite sides of the gate stack. The first storage capacitor includes an anode and a cathode. The first source or drain region is coupled to the anode of the first storage capacitor non-selectively, and does not have stressor material with a lattice constant different from that of a channel region in the body structure. The second source or drain structure is coupled to the anode of the first storage capacitor selectively, and has the stressor material.

20 Claims, 10 Drawing Sheets

ASYMMETRICALLY STRESSED FIELD EFFECT TRANSISTOR IN DYNAMIC CELL

TECHNICAL FIELD

The present disclosure is generally related to asymmetrically stressed field effect transistor in a dynamic cell.

BACKGROUND

Field effect transistors (FETs) introduced with mechanical stress applied to a channel region have enhanced speed performance. In some approaches, in an FET, stressor material with a lattice constant different from that of a channel region is grown in a source region and a drain region. Lattice mismatch between material of the channel region and the stressor material causes mechanical stress applied to the channel region, thereby increasing carrier mobility in the channel region and the driving capability of the FET.

However, accompanying with the use of the stressor material, a leakage current of the FET when the FET is in an OFF state is increased. For example, stressor material such as SiGe adopted in a p-channel FET has a narrower bandgap than material such as Si in a body region of the FET. Therefore, junction leakage is increased due to band-to-band tunneling. Such increase in leakage current in a dynamic cell, such as a dynamic random access memory cell, adversely impacts data retention performance.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Figure 1:
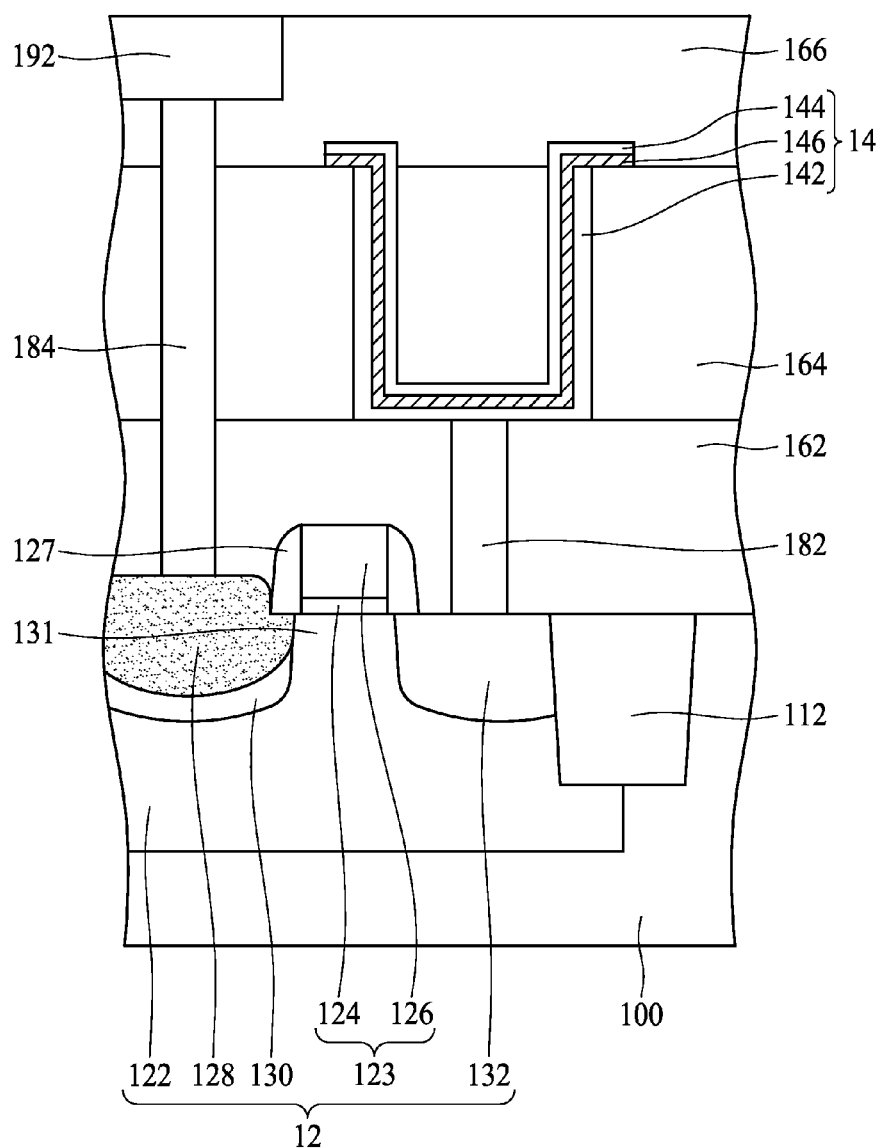
FIG. 1 is a cross-sectional diagram of a portion of a DRAM cell with a stack capacitor in accordance with some embodiments.

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

Memory Cell with Asymmetrically Stressed Field Effect Transistor

FIG. 1 is a cross-sectional diagram of a portion of a dynamic random access memory (DRAM) cell 1 with a stack capacitor in accordance with some embodiments. The DRAM cell 1 includes a substrate 100, an FET 12, a shallow trench isolation (STI) region 112, conductive plugs 182 and 184, a storage capacitor 14, a conductive line 192 and interlayer dielectric (ILD) 162, 164 and 166. The FET 12 includes a body structure 122, a gate stack 123 including a gate dielectric 124 and a gate conductor 126, side wall spacers 127, stressor material 128, a source or drain region 130 and the other source or drain region 132. The storage capacitor 14 includes an anode 142, a cathode 144 and a dielectric layer 146. In some embodiments, the conductive line 192 is a bit line. In other embodiments, the conductive line 192 is a complementary bit line. The bit line or complementary bit line are also called a data line or a complementary data line because the conductive line 192 carries data for a corresponding memory cell.

In some embodiments, the substrate 100 is a p-type substrate. Examples of a p-type substrate include a bulk silicon substrate, a silicon-on-insulator (SOI) substrate doped with p-type dopants such as boron (B) and boron difluoride ($BF_2$), or other suitable semiconductor materials.

In some embodiments, the FET 12 is a p-channel FET. The body structure 122 is an N-well region in the substrate 100. In other embodiments, the body structure 122 is an n-type substrate. The body structure 122 includes, for example, silicon doped with n-type dopants such as phosphorous (P) and arsenic (As). The gate stack 123 includes the dielectric layer 124 and the gate conductor 126, and is formed over the body structure 122. The dielectric layer 124 is made of silicon oxide, silicon nitride, high-k dielectric or other suitable dielectric material. The gate electrode 126 is made of polysilicon, metal or other suitable materials. The side wall spacers 127 are configured to be on the opposite side walls of the gate stack 123 for the source or drain regions 130 and 132 and the stressor 128 material to be properly offset from the gate stack 123. The source or drain region 130 and 132 are located in the body structure 122 on two sides of the gate stack 123. A channel region 131 is formed when the FET 12 is in a conducting state and is located in the body structure 122 between the source or drain regions 130 and 132. The source or drain region 130 includes the stressor material 128 in place of the material forming the body structure 122 while the source or drain region 132 does not include the stressor material 128. The stressor material 128 has a lattice constant greater than that of the channel region 131 in the body structure 122. In some embodiments, the channel region 131 in the body structure 122 has the lattice constant of Si and the stressor material 128 has the lattice constant of SiGe. In other embodiments, the channel region 131 has a lattice constant of $Si_mGe_{1-m}$ and the stressor material has a lattice constant of $Si_nGe_{1-n}$, where m is greater than n. The source or drain regions 130 and 132 are doped heavily with a p-type dopant. In some embodiments, lightly doped drain (LDD) regions (not shown) are formed adjacent to the source or drain regions 130 and 132 and near the channel region 131 to alleviate short channel effects and hot carrier effects.

In the embodiments illustratively shown in FIG. 1, the FET 12 is a planar FET. In alternative embodiments, the FET is a non-planar FET. The body structure includes a non-planar channel region configured over the substrate. The source or drain regions are also configured over the substrate adjacent to the channel region.

In some embodiments, the storage capacitor 14 is a stack capacitor which stacks over the source or drain region 132 through the conductive plug 182. In some embodiments, the anode 142 is U-shaped. In other embodiments, the anode 142 includes horizontal fins along inner and/or outer vertical side walls of the U-shaped anode 142 to increase capacitance. The dielectric layer 146 covers a portion of the anode 142 such as the inner vertical side wall and a top side wall. The cathode 144 covers a portion of the dielectric layer 146 such as a side of the dielectric layer 146 opposite to the side of the dielectric layer 146 interfaces with the anode 142. In other embodiments, the dielectric layer 146 further covers the outer vertical side wall of the anode 142 and the cathode 144 further covers the dielectric layer 146 so that capacitance is increased. Therefore, the dielectric layer 146 is interposed between the anode 142 and the cathode 144.

The anode 142 of the storage capacitor 14 is coupled to the source or drain region 132 through the conductive plug 182. The conductive line 192 is coupled to the source or drain region 130 through the conductive plug 184. Therefore, the source or drain region 132 is coupled to the anode 142 of the storage capacitor 14 non-selectively, and the source or drain region 130 is coupled to the anode of the storage capacitor 14 selectively. The portions that are coupled selectively are portions that are coupled depending on an operational state of an active element such as the FET 12. The portions that are coupled non-selectively are portions that are coupled regardless of the operational state of the active element. In some embodiments, the operational states of an active element include an ON state and an OFF state. For example, the FET 12 is turned on or off depending a voltage between a source terminal and a gate terminal of the FET 12. Because the stressor material 128 with the lattice constant greater than that of the channel region 131 in the body structure 122 is formed in the source or drain region 130, the channel region 131 between the source or drain regions 130 and 132 is applied with a compressive stress from the side of the source or drain region 130. Such compressive stress to the channel region 131 causes the mobility of holes to be increased. Therefore, the current flowing through the channel region 131 of the FET 12 to charge or discharge the storage capacitor 14 is increased, and the speed performance of the DRAM cell 1 is enhanced. Further, because the source or drain region 132 coupled to the anode 142 of the storage capacitor 14 does not contain the stressor material 128, the leakage current of the FET 12 through the source or drain region 132 when the FET 12 is in the OFF state is reduced. The reduction in leakage current includes, for example, a reduction in a junction leakage current flowing from the source or drain region 132 to the substrate 100 because the bandgap of the material in the source or drain region 132 is not narrowed by the stressor material. As a result, data retained in the storage capacitor 14 is protected from the increased leakage current accompanying the stressor material 128 and is retained longer. Therefore, the DRAM cell 1 with the asymmetrically applied stressor material 128 to the source or drain regions 130 and 132 has the benefit of enhanced speed performance but does not suffer from the degrade in data retention performance.

In the embodiments described with reference to FIG. 1, the structure of the FET with asymmetrically applied stressor material to the source or drain regions is applied in a DRAM cell 1. In other embodiments, such structure is applied in a dynamic cell using a parasitic capacitance as the storage capacitor for data.

Figure 2A:
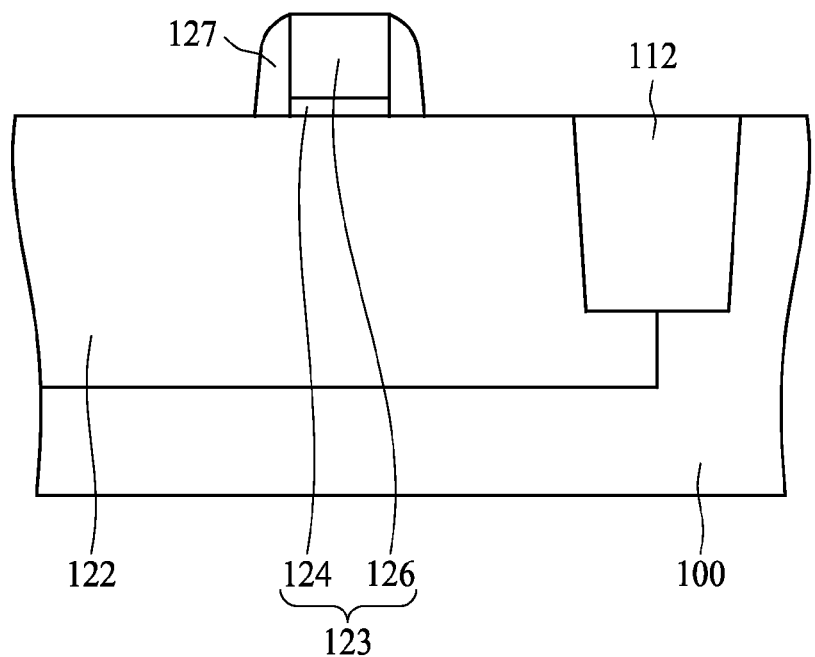
FIGS. 2A to 2E are cross-sectional diagrams of a fabrication process of the DRAM cell in FIG. 1 in accordance with some embodiments.

Method of Fabricating Memory Cell with Asymmetrically Stressed Field Effect Transistor FIGS. 2A to 2E are cross-sectional diagrams of a fabrication process of the DRAM cell 1 in FIG. 1 in accordance with some embodiments. FIG. 2A is an illustration of a partially formed FET in the DRAM cell 1 that has been processed through gate formation. The partially formed FET includes a body structure 122 in the substrate 100, and a gate stack 123 that includes the dielectric layer 124 and the gate conductor 126 formed over the body structure 122. The substrate 100 is, for example, a p substrate, and the body structure 122 is an N-well region. Side wall spacers 127 are also configured to be on the opposite side walls of the gate stack 123. Further, the partially formed FET is isolated by an STI region 112.

Figure 2B:
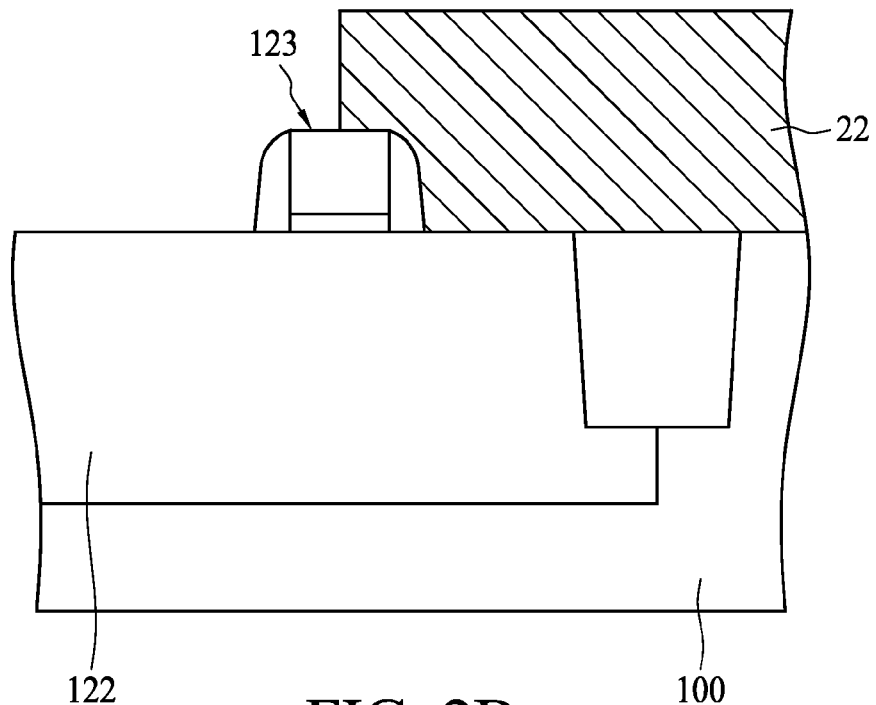

FIG. 2B is an illustration of a mask layer 22 exposing the body structure 122 on one side of the gate stack 123. In FIG. 2B, the mask layer 22 is deposited over the substrate 100 and the gate stack 123, and is patterned to expose the body structure 122 on one side of the gate stack 123. In some embodiments, the mask layer 22 includes, for example, silicon nitride, and is deposited using, for example, chemical vapor deposition (CVD). In some embodiments, the mask layer 22 includes photo resist.

Figure 2C:
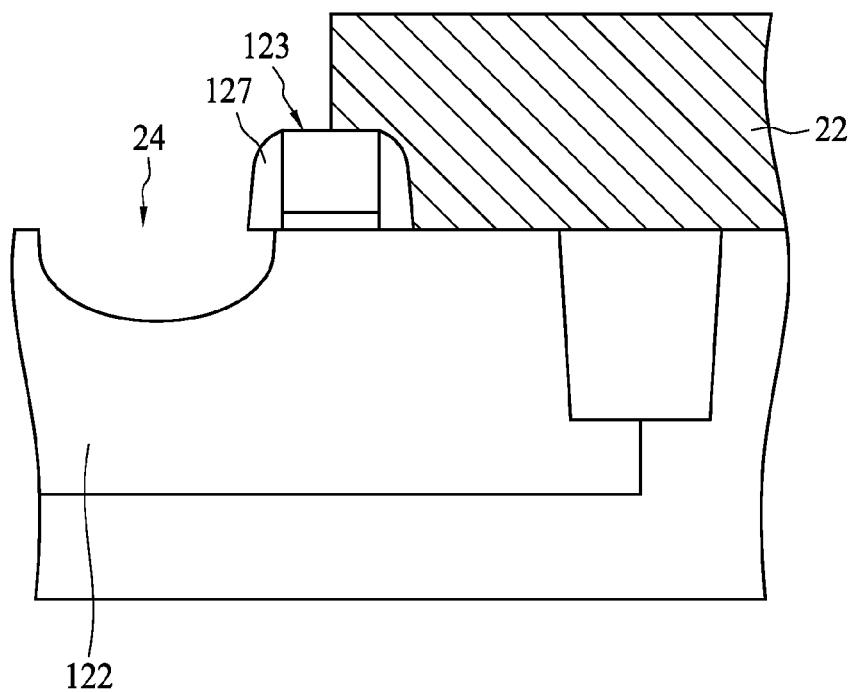

FIG. 2C is an illustration of a recess 24 formed in the body structure 122 on one side of the gate stack 123. In FIG. 2C, the recess 24 is formed into the body structure 122 on the side of the gate stack 123 exposed by the mask layer 22. A proper offset of the recess 24 from the gate stack 123 is achieved through the side wall spacer 127. The recess 24 is formed using, for example, isotropic chemical dry etching. In some embodiments, anisotropic reactive ion etching is alternatively used or is used in combination with the isotropic chemical dry etching. The mask layer 22 is removed after the formation of the recess 24.

Figure 2D:
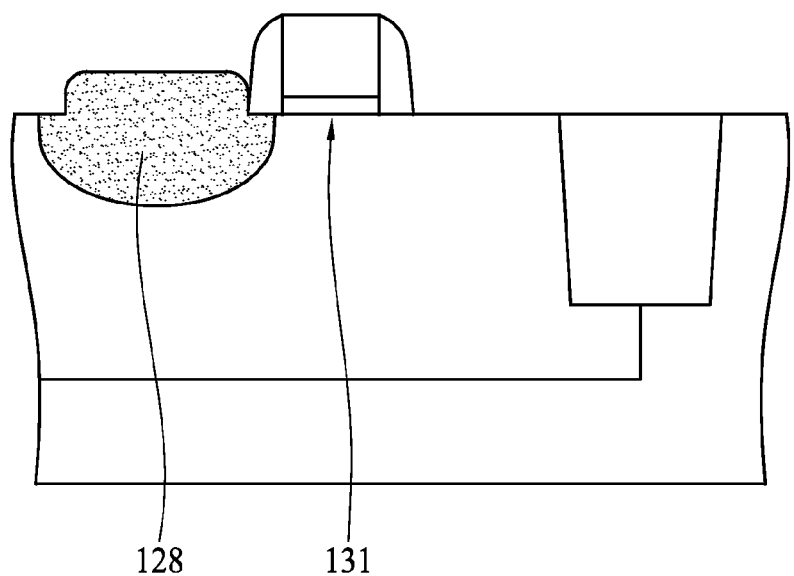

FIG. 2D is an illustration of stressor material 128 formed into the recess 24 in FIG. 2C. In FIG. 2D, the stressor material 128 is epitaxially grown to fill the recess. In some embodiments, the stressor material 128 for the p-type FET is any material that has a lattice constant greater than the lattice constant of the channel region 131. In some embodiments, the channel region 131 has a lattice constant of Si and the stressor material has the lattice constant of SiGe. In some embodiments, the channel region has a lattice constant of $Si_mGe_{1-m}$ and the stressor material has a lattice constant of $Si_nGe_{1-n}$, where m is greater than n. In some embodiments, the stressor material 128 is deposited using low pressure chemical vapor deposition (LPCVD).

FIGS. 2B to 2D illustrates some embodiments for forming the stressor material 128 in the FET 12 shown in FIG. 1. In other embodiments, the recess 24 in FIG. 2C is not formed and ion implantations is used to form the stressor material 128 into the body structure 122. The mask layer 22 covers the gate stack 123 so that ion implantation does not affect the gate conductor 126 shown in FIG. 1. The body structure 122 constructed with, for example, Si is implanted with, for example, Ge ions. Annealing is then performed to form the stressor material 128 in the body structure 122 with a lattice constant greater than that of the channel region 131.

Figure 2E:
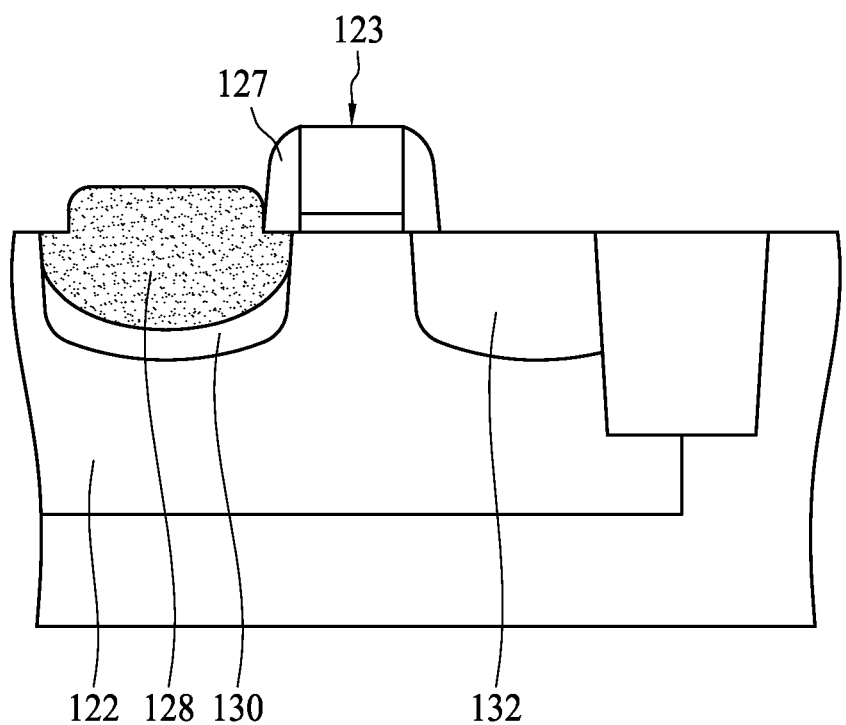

FIG. 2E is an illustration of doped source or drain regions 130 and 132 in the body structure 122. In FIG. 2E, the source or drain regions 130 and 132 are formed through doping. The source or drain regions 130 are offset from the gate stack 123 properly using the side wall spacers 127. In some embodiments, doping is performed in-situ when the stressor material 128 is formed. In other embodiments, doping is performed by implantation after the stressor material 128 is formed.

Referring to FIG. 1, subsequent to formation of the FET 12 in FIG. 1, the FET 12 is covered with the ILD 162. A conductive plug 182 contacting the source or drain region 132 is formed into the ILD 162. In some embodiments, the ILD 162 is $SiO_2$. The conductive plug 182 is formed using, for example, doped polysilicon, or metal such as aluminum, copper, tungsten, titanium, silicide such as PtSi, WSi, $TiSi_2$ or $CoSi_2$. Another ILD 164 is deposited over the ILD 162 and is patterned to have a recess exposing the conductive plug 182. In some embodiments, A conductive layer is deposited into the recess and forming a U-shaped anode 142. A dielectric layer 146 is deposited over the U-shaped anode 142 and covers an inner vertical side wall and a top side wall of the U-shaped anode 142. Another conductive layer is deposited over the dielectric layer 146, forming a cathode 144. After the storage capacitor 14 is formed, the recess is filled with the ILD 164. An ILD 166 is deposited over the storage capacitor 14. A conductive plug 184 is formed into the ILD 162, 164 and 166 and is in contact with the source or drain region 130. A conductive line 192 is formed into the ILD 162 and is coupled to the conductive plug 184.

The fabrication process of the FET in the DRAM cell as illustrated in FIGS. 2A to FIG. 2E is compatible with a fabrication process of logic circuits and therefore, is adopted in a fabrication process of an eDRAM without incurring extra cost.

Another Memory Cell with Asymmetrically Stressed Field Effect Transistor

Figure 3:
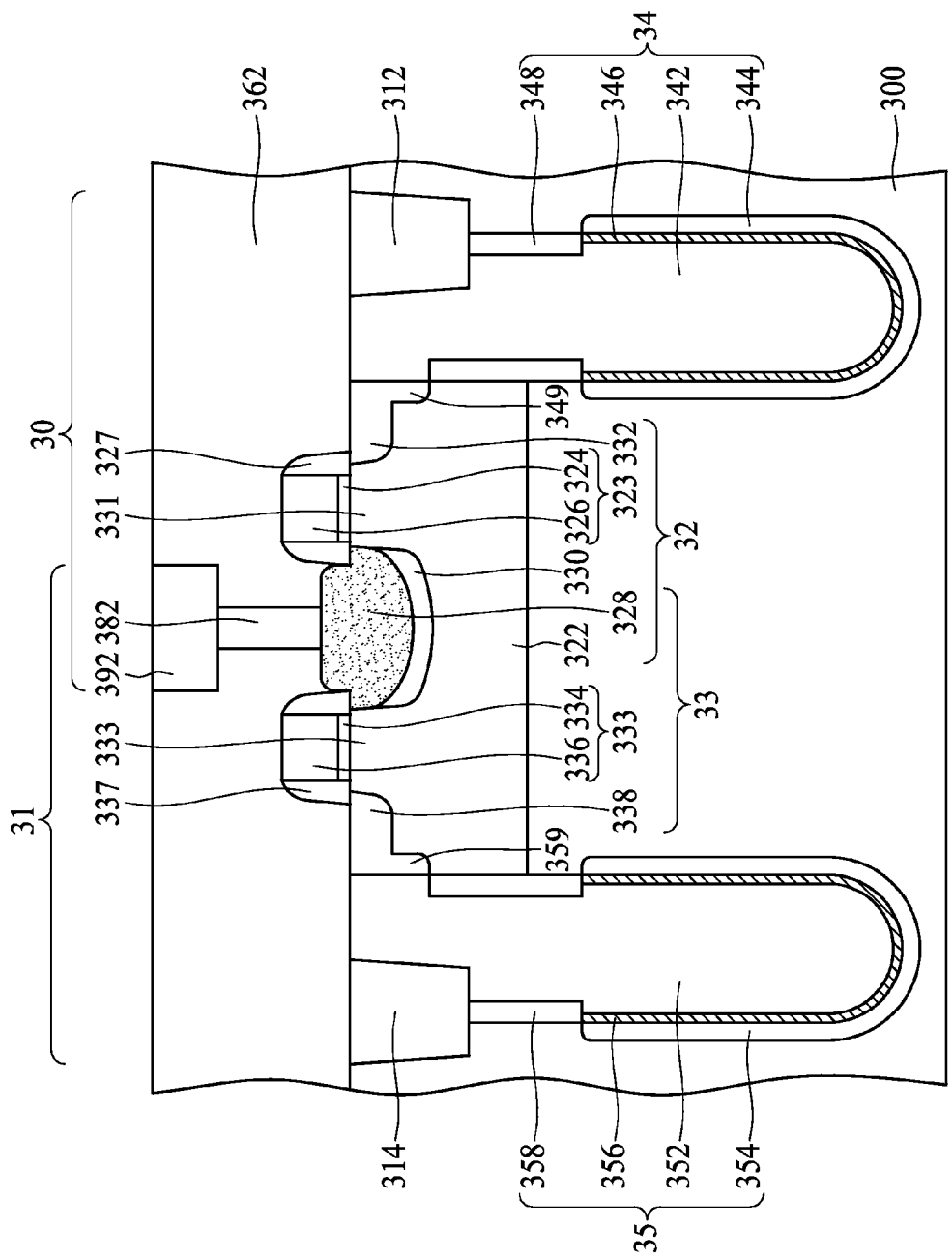
FIG. 3 is a cross-sectional diagram of a portion of two DRAM cells with trench capacitors in accordance with some embodiments.

FIG. 3 is a cross-sectional diagram of a portion of two DRAM cells 30 and 31 with trench capacitors in accordance with some embodiments. The DRAM cell 3 includes a substrate 300, a FET 32, a FET 33, storage capacitors 34 and 35, conductive straps 349 and 359, STI regions 312 and 314, a conductive plug 382, a conductive line 392 and ILD 362. The FET 32 includes a body structure 322, a gate stack 323 including a gate dielectric 324 and a gate conductor 326, side wall spacers 327, stressor material 328, a source or drain region 330 and the other source or drain region 332. The FET 33 includes the body structure 322 shared with the FET 32, a gate stack 333 including a gate dielectric 334 and the gate conductor 336, side wall spacers 337, the stressor material 328 and the source or drain region 330 shared with the FET 32, and a source or drain region 338. The storage capacitor 34 includes an anode 342, a cathode 344, a dielectric layer 346 and a collar 348. Similarly, the storage capacitor 35 includes an anode 352, a cathode 354, a dielectric layer 356 and a collar 358. The conductive line 392 is shared between the DRAM cell 30 including the FET 32 and the storage capacitor 34, and the DRAM cell 31 including the FET 33 and the storage capacitor 35. In some embodiments, the conductive line 392 is a bit line. In other embodiments, the conductive line 392 is a complementary bit line.

The substrate 300, the FETs 32 and 33 are similar to the substrate 100, the FET 12 described with reference to FIG. 1 and are omitted here.

In some embodiments, the storage capacitor 34 is a trench capacitor which is formed into the substrate 300 and is coupled to the source or drain region 332 through the conductive strap 349. In some embodiments, a trench in the substrate 300 is filled with, for example, polysilicon heavily doped with p-type dopants, such as boron (B). The polysilicon serves as the anode 342 of the storage capacitor 34. The cathode 344 of the storage capacitor 34 is formed by a buried doping region doped with p-type dopants. A dielectric layer 346 is interposed between the anode 342 and the cathode 344. The collar 348 is formed at the top of the trench. The collar 348 prevents punchthrough of the junction of the source or drain region 332 and the body structure 322 to the cathode 344. The collar 348 defines the bottom of the conductive strap 349 and the top of the cathode 344. Connection of the FET 32 to the storage capacitor 34 is achieved via the conductive strap 349. In other embodiments, connection of the FET 32 to the storage capacitor 34 is achieved through a metallization layer over the substrate 300. The conductive strap 349 is formed by the p-type dopants outdiffused from the p-type doped polysilicon in the trench. The storage capacitor 35 is similar to the storage capacitor 34 and the conductive strap 359 is similar to the conductive strap 349 and are omitted here. In some embodiments, the cathode 344 of the storage capacitor 34 and the cathode 354 of the storage capacitor 35 are coupled to each other through the p-type doped substrate 300.

The anode 342 of the storage capacitor 34 is coupled to the source or drain region 332 through the conductive strap 349. The anode 352 of the storage capacitor 35 is coupled to the source or drain region 338 through the conductive strap 359. The conductive line 392 is coupled to the source or drain region 330 through the conductive plug 382. Because the stressor material 328 with the lattice constant greater than that of the channel region 331 and the channel region 333 in the body structure 322 is deposited in the source or drain region 330, the channel region 331 between the source or drain regions 330 and 332, and the channel region 333 between the source or drain regions 330 and 338 are each applied with a compressive stress from the side of the source or drain region 330. Therefore, the current flowing through the channel region 331 of the FET 32 to charge or discharge the storage capacitor 34 is increased, and the speed performance of the DRAM cell 30 is enhanced. Also, the current flowing through the channel region 333 of the FET 33 to charge or discharge the storage capacitor 35 is increased, and the speed performance of the DRAM cell 31 is enhanced. Further, because the source or drain region 332 coupled to the anode 342 of the storage capacitor 34 and the source or drain region 338 coupled to the anode 352 of the storage capacitor 35 do not contain the stressor material 328, a leakage current of the FET 32 through the source or drain region 332 when the FET 32 is in the OFF state, and a leakage current of the FET 33 through the source or drain region 338 when the FET 33 is in the OFF state are reduced. As a result, data retained in the storage capacitor 34 and the storage capacitor 35 are protected from the increased leakage current accompanying the stressor material 328 and is retained longer. Therefore, the DRAM cell 30 with the asymmetrically applied stressor material 328 to the source or drain regions 330 and 332, and the DRAM cell 31 with the asymmetrically applied stressor material 328 to the source or drain regions 330 and 338 have the benefit of enhanced speed performance but do not suffer from the degrade in data retention performance.

Figure 4A:
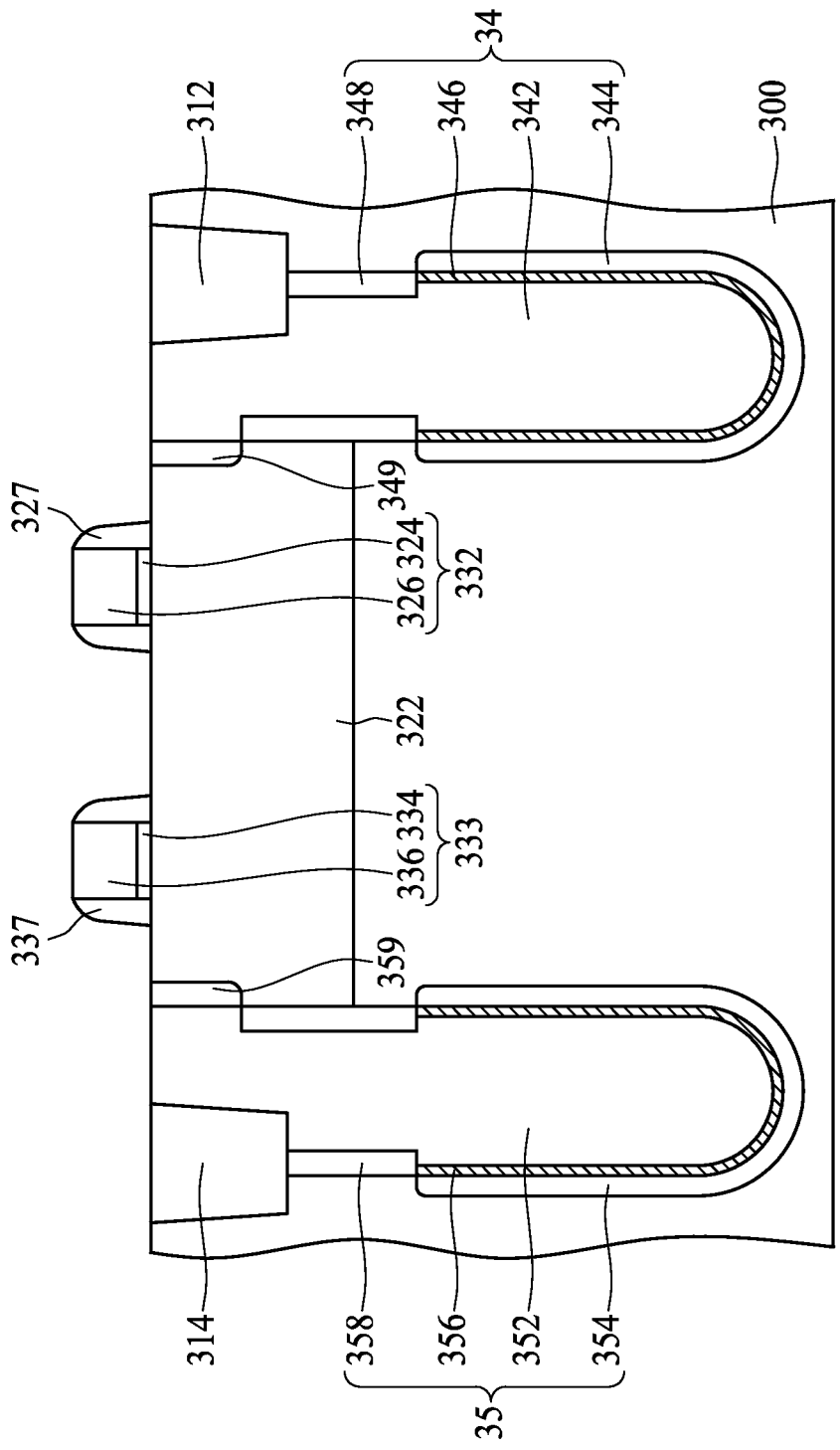
FIGS. 4A to 4E are cross-sectional diagrams of a fabrication process of the DRAM cells in FIG. 3 in accordance with some embodiments.

Another Method of Fabricating Memory Cell with Asymmetrically Stressed Field Effect Transistor FIGS. 4A to 4E are cross-sectional diagrams of a fabrication process of the DRAM cells 30 and 31 in FIG. 3 in accordance with some embodiments. FIG. 4A is an illustration of storage capacitors 34 and 35, partially formed FETs that have been processed through gate formation and conductive straps 349 and 359 for connecting the storage capacitors 34 and 35 to the FETs 32 and 33 shown in FIG. 3, respectively. The storage capacitor 34 is formed using known approaches. The storage capacitor 34 includes an anode 342, a cathode 344, a dielectric layer 346 and a collar 348. A trench in the substrate 300 is filled with polysilicon heavily doped with p-type dopants. The doped polysilicon serve as an anode 342 of the storage capacitor 34. A buried doping region 344 doped with p-type dopants surrounds the bottom portion of the trench and serves as the cathode of the storage capacitor 35. The anode 342 and the cathode 344 are isolated from each other by a dielectric layer 346. In an upper portion of the trench, a collar 348 is formed. The collar includes dielectric material. The conductive strap 349 is formed by the p-type dopants outdiffused from the p-type doped polysilicon in the trench. The storage capacitor 35 is formed similarly as the storage capacitor 34 and includes an anode 352, a cathode 354, a dielectric layer 356 and a collar 358.

In FIG. 4A, the partially formed FETs are provided in a substrate 300 and are isolated by STI regions 312 and 314. One of the partially formed FETs includes a body structure 322 in the substrate 300, and a gate stack 323 that includes the dielectric layer 324 and the gate conductor 326 formed over the body structure 322. The substrate 300 is, for example, a p substrate, and the body structure 322 is an N-well region. Side wall spacers are also configured on the opposite side walls of the gate stack 323. The other of the partially formed FETs is formed similarly and includes the shared body structure 322, and a gate stack 333 that includes the dielectric layer 334 and the gate conductor 336 formed over the body structure 322.

Figure 4B:
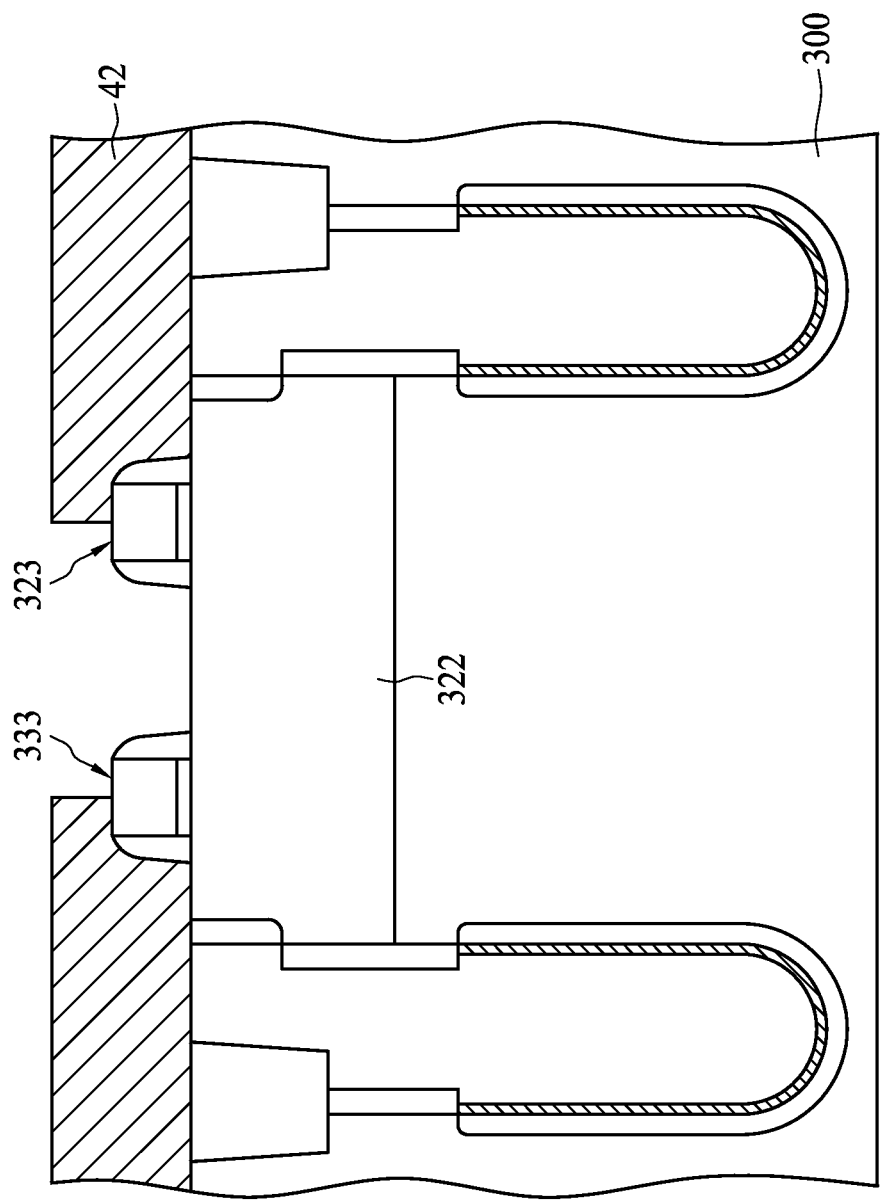

FIG. 4B is an illustration of a mask layer 42 exposing the body structure 322 between the gate stack 323 and the gate stack 333. In FIG. 4B, the mask layer 42 is deposited over the substrate 300 and the gate stacks 323 and 333. The mask layer 42 includes, for example, silicon nitride, and is deposited using, for example, CVD.

Figure 4C:
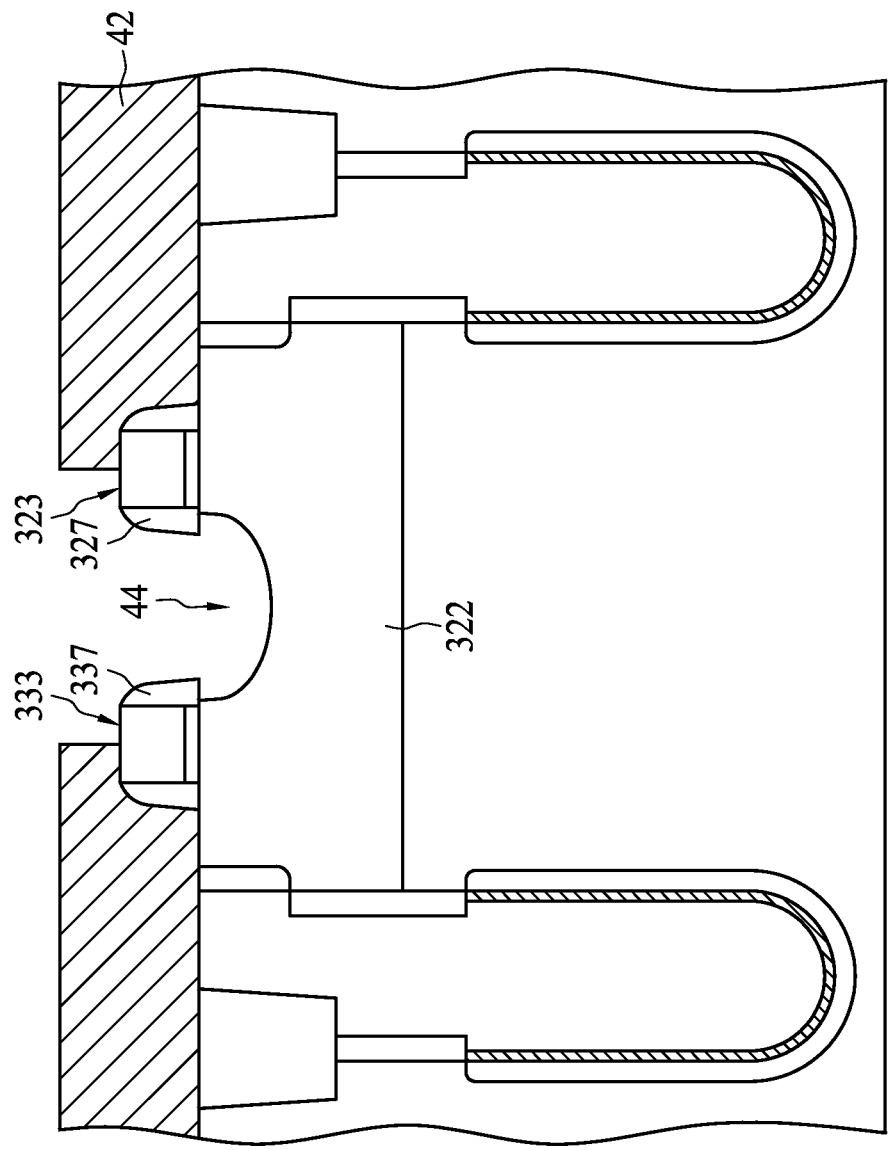

FIG. 4C is an illustration of a recess 44 formed in the body structure 322 between the gate stacks 323 and 333. In the recess 44 is formed into the body structure 322 between the gate stacks 323 and 333 exposed by the mask layer 44. A proper offset of the recess 44 from the gate stacks 323 and 333 are achieved through the side wall spacers 327 and 337, respectively. The recess 44 is formed using, for example, isotropic chemical dry etching. In some embodiments, anisotropic reactive ion etching is alternatively used or is used in combination with the isotropic chemical dry etching. The mask layer 44 is removed after the formation of the recess 44.

Figure 4D:
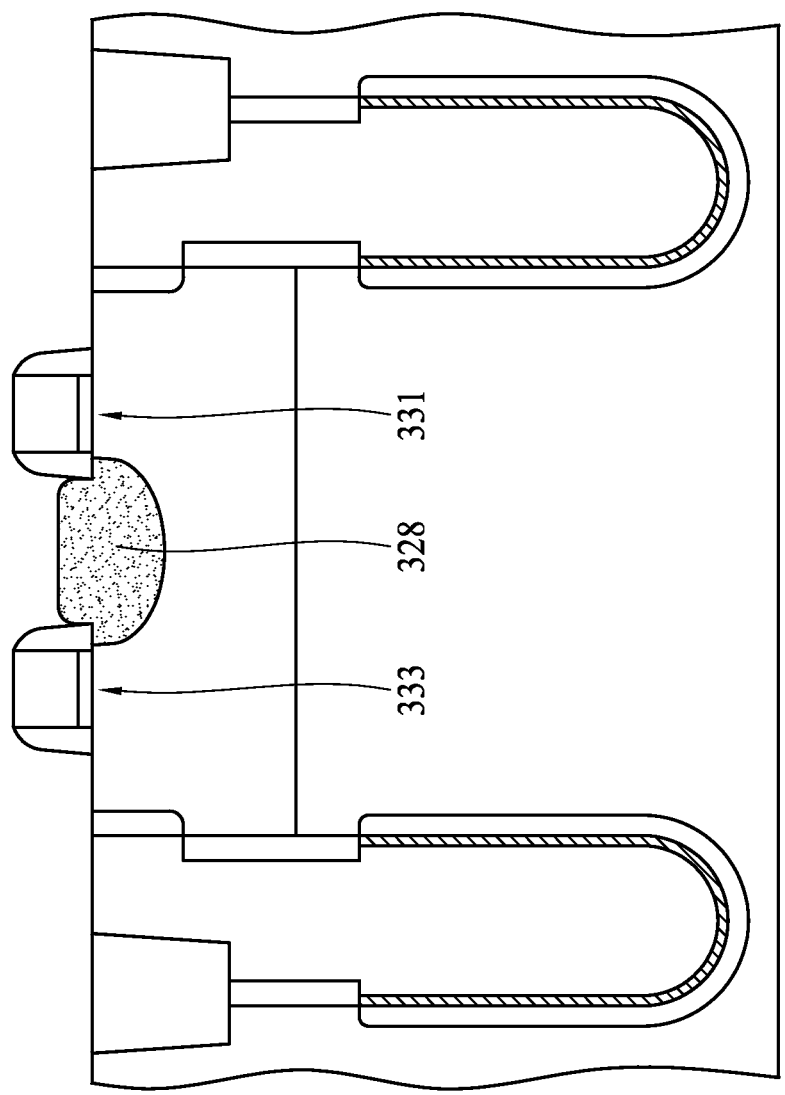

FIG. 4D is an illustration of stressor material 328 deposited into the recess 44 in FIG. 4C. In FIG. 4D, the stressor material 328 is epitaxially grown to fill the recess. In some embodiments, the stressor material 328 for the p-type FET is any material that has a lattice constant greater than the lattice constant of the channel regions 331 and 333. In some embodiments, the channel regions 331 and 333 have a lattice constant of Si and the stressor material has the lattice constant of SiGe. In other embodiments, the channel region has a lattice constant of $Si_mGe_{1-m}$ and the stressor material has a lattice constant of $Si_nGe_{1-n}$, where m is greater than n. In some embodiments, the stressor material 328 is deposited using LPCVD.

FIGS. 4B to 4D illustrates some embodiments for forming the stressor material 328 in the FETs 32 and 33 shown in FIG. 3. In other embodiments, the recess 44 in FIG. 4C is not formed and ion implantations is used to form the stressor material 328 into the body structure 322. The mask layer 42 covers the gate stacks 323 and 333 so that ion implantation does not affect the gate conductors 326 and 336 shown in FIG. 3. The body structure 122 constructed with, for example, Si is implanted with, for example, Ge ions. Annealing is then performed to form the stressor material 328 in the body structure 322 with a lattice constant greater than that of the channel regions 331 and 333.

Figure 4E:
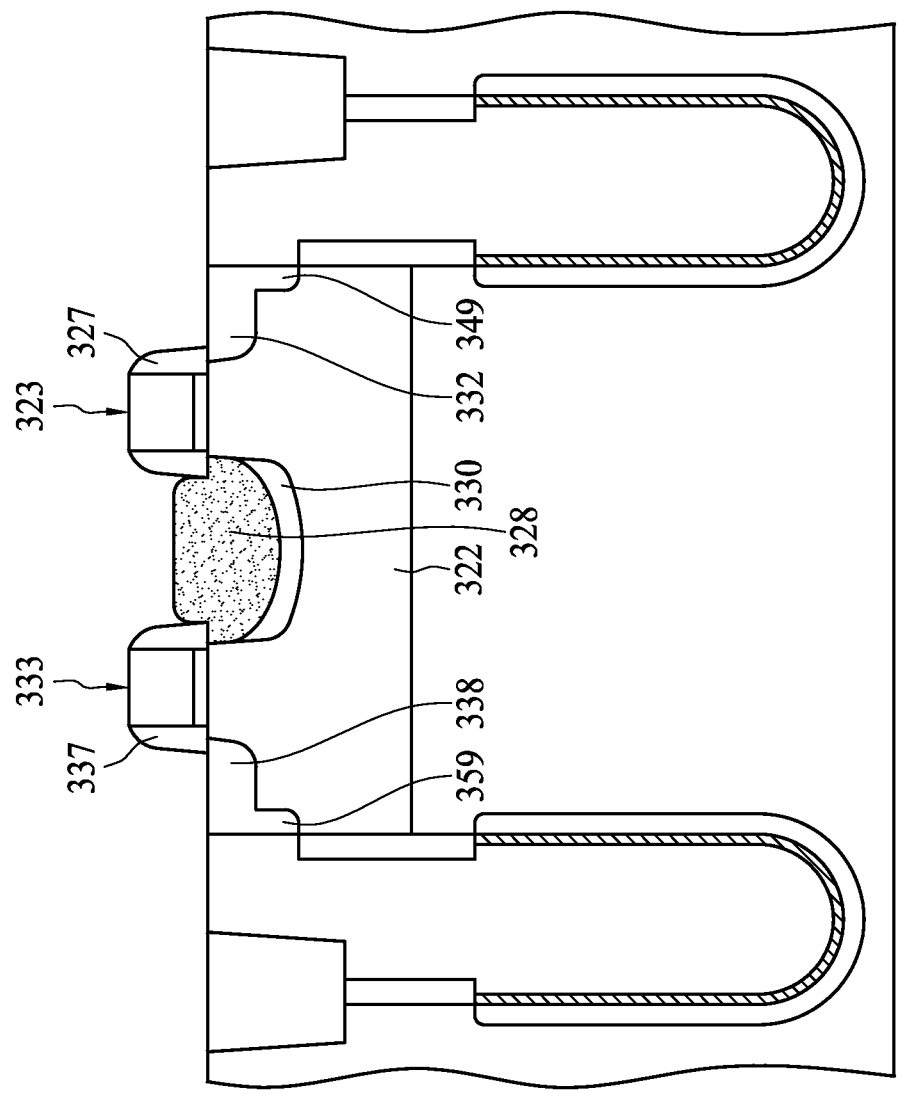

FIG. 4E is an illustration of doped source or drain regions 332 and 338 in the body structure 322. In FIG. 4E, the source or drain regions 332 and 338 are formed through doping. The source or drain regions 330 and 332 are offset from the gate stack 323 properly using the side wall spacers 327. The source or drain region 330 and 338 are offset from the gate stack 333 properly using the side wall spacers 337. In some embodiments, doping is performed in-situ when the stressor material 328 is formed. In other embodiments, doping is performed by implantation after the stressor material 328 is formed. The source or drain regions 332 and 338 are coupled to the conductive straps 349 and 359, respectively.

Referring to FIG. 3, subsequent to the formation of the FET 32 and the FET 33 in FIG. 3, the FETs 32 and 33 are covered with the ILD 362. A conductive plug 382 contacting the source or drain region 330 is formed into the ILD 362. In some embodiments, the ILD 362 is $SiO_2$. The conductive plug 382 is formed using, for example, doped polysilicon, or metal such as aluminum, copper, tungsten, titanium, silicide such as PtSi, $WSi_2$, $TiSi_2$ or $CoSi_2$. A conductive line 392 is formed into the ILD 362 and is coupled to the conductive plug 382.

The fabrication process of the DRAM cells as illustrated in FIGS. 4A to 4E are compatible with a fabrication process of logic circuits and therefore, is adopted in a fabrication process of an eDRAM without incurring extra cost.

In some embodiments, the DRAM cell with asymmetrically applied stressor material to the source or drain regions has the benefit of enhanced speed performance but does not suffer from the degrade in data retention performance. In some embodiments, the fabrication method of the FET with asymmetrically applied stressor material to the source or drain regions in the DRAM cell is compatible with a fabrication process of logic circuits and therefore, is adopted in a fabrication process of an eDRAM without incurring extra cost.

In some embodiments, a circuit element includes a first FET and a first storage capacitor. The first FET includes a gate stack, a first source or drain region, a second source or drain region and a body structure. The gate stack is configured over the body structure. The first source or drain region and the second source or drain region are configured on opposite sides of the gate stack. The first storage capacitor includes an anode and a cathode. The first source or drain region is coupled to the anode of the first storage capacitor non-selectively, and does not have stressor material with a lattice constant different from that of a channel region in the body structure. The second source or drain structure is coupled to the anode of the first storage capacitor selectively, and has the stressor material.

In some embodiments, a semiconductor structure includes a first structure, a first stack of dielectric layer and conductive layer, a first doping region and a second doping region, a first anode, a first cathode and a first dielectric material. The first structure is doped with a first conductive type. The first stack of dielectric layer and conductive layer is over the first structure. The first doping region and the second doping region are of the second conductive type and located in the first structure on the opposite sides of the first stack of dielectric layer and conductive layer. The first dielectric material is interposed between the first anode and the first cathode. The first doping region is coupled to the first anode non-selectively, and does not have stressor material with a lattice constant different from that of a region between the first doping region and the second doping region in the first structure. The second doping region is coupled to the anode of the first anode selectively, and has the stressor material.

In some embodiments, in a method, a body structure with a first gate stack configured thereon is provided. A mask layer that exposes the body structure on one side of the first gate stack and covers the body structure on the other side of the first gate stack is formed. A recess is formed into the body structure on the exposed side of the first gate stack. Stressor material with a lattice constant different that of a channel region in the body structure is formed into the recess. A first source or drain region and a second source or drain region are doped on the opposite sides of the first gate stack. The second source or drain region is formed at where the stressor material is located. An anode of a first storage capacitor coupled to the first source or drain region non-selectively is formed.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A circuit element, comprising:
a first field effect transistor (FET), comprising a gate stack, a first source or drain region, a second source or drain region and a body structure,
wherein
the gate stack is configured over the body structure;
the first source or drain region and the second source or drain region are configured on opposite sides of the gate stack; and
a first storage capacitor, comprising an anode and a cathode;
wherein
the first source or drain region is coupled to the anode of the first storage capacitor non-selectively, and does not have stressor material with a lattice constant different from that of a channel region in the body structure; and
the second source or drain structure is coupled to the anode of the first storage capacitor selectively, and has the stressor material.

2. The circuit element according to claim 1, wherein the first FET is a p-channel FET; and
the stressor material is SiGe.

3. The circuit element according to claim 1, wherein the first storage capacitor is a stack capacitor or a trench capacitor.

4. The circuit element according to claim 1, further comprising:
a second FET, comprising a gate stack, a first source or drain region, a second source or drain region and the body structure,
wherein
the gate stack of the second FET is configured over the body structure;
the first source or drain region and the second source or drain region of the second FET are configured on the opposite sides of the gate stack of the second FET; and
the second source or drain region of the first FET and the second source or drain region of the second FET are shared;
a second storage capacitor, comprising an anode and a cathode;
wherein
the first source or drain region of the second FET is coupled to the anode of the second storage capacitor non-selectively, and does not have the stressor material; and
the second source or drain region of the second FET is coupled to the anode of the second storage capacitor selectively, and has the stressor material.

5. The circuit element according to claim 2, wherein the circuit element is a memory cell; and
the first source or drain region is coupled to a data line or a complementary data line.

6. The circuit element according to claim 4, further comprising:
a first isolation region and a second isolation region,
wherein
the first FET and the second FET are configured between the first isolation region and the second isolation region.

7. A semiconductor structure, comprising:
a first structure doped with a first conductive type;
a first stack of dielectric layer and conductive layer over the first structure;
a first doping region and a second doping region of a second conductive type located in the first structure on opposite sides of the first stack of dielectric layer and conductive layer;
a first anode;
a first cathode; and
a first dielectric material interposed between the first anode and the first cathode,
wherein
the first doping region is coupled to the first anode non-selectively, and does not have stressor material with a lattice constant different from that of a region between the first doping region and the second doping region in the first structure; and
the second doping region is coupled to the first anode selectively, and has the stressor material.

8. The semiconductor structure according to claim 7, wherein
the first conductive type is n-type and the second conductive type is p-type; and
the stressor material has a lattice constant greater than that of the first structure.

9. The semiconductor structure according to claim 7, wherein
the anode and the cathode are formed in a substrate or formed over the second doping region.

10. The semiconductor structure according to claim 7, further comprising:
a second stack of dielectric layer and conductive layer configured over the first structure;
a third doping region of the second conductive type configured in the first structure on the opposite side of the first doping region with respect to the second stack of dielectric and conductive layers;
a second anode;
a second cathode; and
a second dielectric material interposed between the second anode and the second cathode,
wherein
the second doping region is coupled to the second anode selectively; and
the third doping region is coupled to the second anode non-selectively and does not have the stressor material.

11. The semiconductor structure according to claim 8, wherein
the semiconductor structure is a memory cell; and
the first doping region is coupled to a data line or a complementary data line.

12. The semiconductor structure according to claim 10, further comprising:
a first isolation region and a second isolation region, wherein
the first doping region and the third doping region is configured between the first isolation region and the second isolation region.

13. A method, comprising:
providing a body structure with a first gate stack configured thereon;
forming a mask layer that exposes the body structure on one side of the first gate stack and covers the body structure on the other side of the first gate stack;
forming a recess into the body structure on the exposed side of the first gate stack;
forming stressor material with a lattice constant different from that of a channel region in the body structure into the recess; and
doping a first source or drain region and a second source or drain region on the opposite sides of the first gate stack, wherein
the second source or drain region is formed at where the stressor material is located;
forming an anode of a first storage capacitor coupled to the first source or drain region non-selectively.

14. The method according to claim 13, wherein
the body structure is n-type, and the first source or drain region and the second source or drain region are p-type; and
the stressor material has a lattice constant greater than the body structure.

15. The method according to claim 13, wherein forming a recess into the body structure on the exposed side of the first gate stack comprises:
anisotropic reactive ion etching or anisotropic reactive ion etching in combination with isotropic chemical dry etching.

16. The method according to claim 13, wherein forming stressor material with a lattice constant different from that of the body structure into the recess comprises epitaxial deposition.

17. The method according to claim 13, further comprising:
forming a data line or a complementary data line coupled to the first source or drain region.

18. The method according to claim 13, wherein forming an anode of a first storage capacitor coupled to the first source or drain region non-selectively comprises:
forming a conductive plug on the first source or drain region; and
forming the anode of the first storage capacitor over and coupled to the first source or drain region through the conductive plug.

19. The method according to claim 13, wherein forming an anode of a first storage capacitor coupled to the first source or drain region non-selectively comprises:
forming the anode of the first storage capacitor in a substrate; and
coupling the anode and the first source or drain region through diffusion.

20. The method according to claim 13, further comprising:
providing a second gate stack configured on the body structure such that the second source or drain region is shared;
forming the mask layer that further covers the body structure on the side of the second gate stack opposite to the second source or drain region; and
doping a third source or drain region on the side of second gate stack opposite to the second source or drain region; and
forming an anode of a second storage capacitor coupled to the third source or drain region non-selectively.

* * * * *